(12) United States Patent
Bas et al.

(10) Patent No.: US 7,342,458 B2
(45) Date of Patent: Mar. 11, 2008

(54) NEGATIVE GAIN TRANSDUCTANCE AMPLIFIER CIRCUIT

(75) Inventors: Gilles Bas, Beauvoisin (FR); Hervé Barthelemy, Toulon (FR)

(73) Assignees: STMicroelectronics (Rousset) SAS, Rousset (FR); Universite de Provence (Aix-Marseille I), Marseille Cedex (FR)

( * ) Notice: Subject to any disclaimer, the term of this patent is extended or adjusted under 35 U.S.C. 154(b) by 137 days.

(21) Appl. No.: 11/290,618

(22) Filed: Nov. 29, 2005

(65) Prior Publication Data

US 2006/0186966 A1 Aug. 24, 2006

(30) Foreign Application Priority Data

Nov. 30, 2004 (FR) .................. 04 12703

(51) Int. Cl.
*H03F 3/68* (2006.01)
*H03H 11/00* (2006.01)

(52) U.S. Cl. .................. 330/302; 333/215
(58) Field of Classification Search ............ None
See application file for complete search history.

(56) References Cited

U.S. PATENT DOCUMENTS

| | | | | |
|---|---|---|---|---|
| 3,963,992 A * | 6/1976 | Hekimian et al. | .......... | 330/127 |
| 5,506,496 A * | 4/1996 | Wrathall et al. | .......... | 323/316 |
| 6,087,847 A * | 7/2000 | Mooney et al. | .......... | 326/30 |
| 6,157,206 A * | 12/2000 | Taylor et al. | .......... | 326/30 |
| 6,198,089 B1 * | 3/2001 | Shi | .......... | 250/208.2 |
| 6,208,206 B1 * | 3/2001 | Leung et al. | .......... | 330/107 |
| 6,333,623 B1 * | 12/2001 | Heisley et al. | .......... | 323/280 |
| 6,362,687 B2 * | 3/2002 | Cox | .......... | 330/253 |
| 6,429,679 B1 * | 8/2002 | Kim et al. | .......... | 326/30 |
| 6,429,685 B1 * | 8/2002 | Stockstad | .......... | 326/83 |
| 6,466,077 B1 * | 10/2002 | Miyazaki et al. | .......... | 327/534 |
| 6,573,746 B2 * | 6/2003 | Kim et al. | .......... | 326/30 |
| 6,717,471 B2 * | 4/2004 | Arayashiki et al. | .......... | 330/278 |
| 6,730,080 B2 * | 5/2004 | Harano et al. | .......... | 606/38 |
| 6,989,666 B2 * | 1/2006 | Kawase | .......... | 324/117 R |
| 7,009,446 B2 * | 3/2006 | Yoshida et al. | .......... | 327/552 |
| 7,102,437 B2 * | 9/2006 | Perry | .......... | 330/259 |

(Continued)

FOREIGN PATENT DOCUMENTS

JP 02228107 9/1990

OTHER PUBLICATIONS

ThartFah Voo et al., "Efficient Tunable Continuous-Time Integrated Current-Mode Filter Designs", IEEE 1996, pp. 93-96.

(Continued)

*Primary Examiner*—Robert Pascal
*Assistant Examiner*—Krista M Flanagan

(57) ABSTRACT

The invention proposes a negative gain transconductance amplifier circuit (1) for capacitive load that includes:

an RC serial circuit connected between an input terminal (E) of the amplifier circuit and a intermediate terminal (A);

an amplification level connected between the intermediate terminal and an output terminal (S) designed to be connected to a capacitive load, and which includes:

a first negative gain transconductance amplifier (2) connected via open loop between the intermediate terminal and the output terminal;

a second negative gain transconductance amplifier (3) with characteristics that are notably identical to those of the first amplifier, connected via closed loop; its input and output are connected to the intermediate terminal via a resistance (R1).

20 Claims, 4 Drawing Sheets

U.S. PATENT DOCUMENTS

| | | | |
|---|---|---|---|
| 7,135,931 B2* | 11/2006 | Prodanov | 330/302 |
| 7,180,364 B2* | 2/2007 | Kimura | 327/553 |
| 7,212,071 B2* | 5/2007 | Christensen | 330/252 |
| 2002/0021167 A1* | 2/2002 | Lee | 330/9 |
| 2002/0153944 A1 | 10/2002 | Uchiki et al. | |
| 2004/0046605 A1* | 3/2004 | Granville | 330/9 |
| 2006/0135107 A1* | 6/2006 | Staszewski et al. | 455/307 |

OTHER PUBLICATIONS

Ali Telli et al., "CMOS LNA Design for Leo Space S-Band Applications", IEEE 2003, pp. 27-30.

* cited by examiner

NEGATIVE GAIN TRANSDUCTANCE AMPLIFIER CIRCUIT

CROSS-REFERENCE TO RELATED APPLICATIONS

The present application is related to French Patent Application No. 04/12703, filed Nov. 30, 2004, entitled "NEGATIVE GAIN TRANSCONDUCTANCE AMPLIFIER CIRCUIT". French Patent Application No. 04/12703 is assigned to the assignee of the present application and is hereby incorporated by reference into the present disclosure as if fully set forth herein. The present application hereby claims priority under 35 U.S.C. §119(a) to French Patent Application No. 04/12703.

This invention relates to linear amplifiers, in particular negative gain transconductance amplifier circuits.

The document Patent Abstracts of Japan, Vol 014, # 537 (E-1006), dated Nov. 27, 1990 describes an amplifier circuit that includes a first closed loop inverter with a first resistance, connected to a second open loop inverter using a second resistance. The values of the first and second resistances are the same.

This amplifier circuit is not optimised and has limited passband.

FIG. 1 illustrates a known example of an integrated linear amplifier 1 connected to a capacitive load $C_L$. Amplifier circuit 1 comprises a CMOS inverter 2 described notably in U.S. Pat. No. 4,178,605. Inverter 2 includes a PMos transistor 21 and an NMos 22 transistor. The source of transistor 21 is connected to a VDD power supply voltage that is sufficiently high for the operating regime of transistors 21 and 22. The source of transistor 22 is grounded. The grids of transistors 21 and 22 are connected to node A of inverter 2. The drains of transistors 21 and 22 are connected to the output S of amplifier circuit 1 and has a capacitive load $C_L$. In a manner that is known per se, amplifier circuit 1 has a resistance R1 connected between A and S, an input resistance Rin and a capacitance C1 serially connected between input E and node A.

When transistors 21 and 22 have an identical channel length ($L_P$ and $L_N$), the auto-polarisation of inverter 2 results in a static polarisation voltage at node A of approximately VDD/2 if the following condition is verified:

$$W_P/W_N = \mu_N/\mu_P$$

Where $W_P$ and $W_N$ are the respective channel widths of transistors 21 and 22, and $\mu_N$ and $\mu_P$ are their respective mobilities.

At the polarisation point, $V_A = V_S = V_{DD}/2$, the transistors 21 and 22 are operating in the saturation regime. The amplitude of the voltage transfer $A_V$ of the amplifier circuit 1 in its passband is therefore approximately as follows:

$$A_V = V_s/V_g \sim -g_m*(R_0*R_1)/(R_0+R_1)$$

where $g_m$ is the sum of the respective transconductances of transistors 21 and 22;

$R_0$ is the output resistance of the inverter.

$R_0$ is defined by $R_0 = 1/(g_{DSN}+g_{DSP})$. $g_{DSP}$ and $g_{DSN}$ are the respective output conductances of transistors 21 and 22.

For a high value of $A_V$, the input impedance of the amplifier circuit is defined by:

$$Z_E \sim R_{in} \sim R_1/A_V$$

For a high value of AV, the output impedance of the amplifier circuit is defined by:

$$Z_S \sim R_1*R_0/(R_1+R_0)$$

For a high value of $A_V$, the low cut-off frequency Fcb and the high cut-off frequency Fch are defined, respectively, by the following formulas:

$$Fcb \sim -A_V/(2\pi*R_1*C_1)$$

$$Fch \sim 1/(2\pi*(R_1*R_0)/(R_1+R_0)*C_L)$$

In practice, there is a need for a voltage transfer of the increased amplifier circuit, for increased input and output impedances, and for a reduced cut-off frequency (for an equivalent product of the gain by the passband.)

The invention relates to solving one or several of these disadvantages. The invention thus relates to a negative gain transconductance amplifier circuit for capacitive load that includes:

an RC serial circuit connected between an input terminal of the amplifier circuit and an intermediate terminal;

an amplification stage connected between the intermediate terminal and an output terminal intended to be connected to a capacitive load, which includes:

a first negative gain transconductance amplifier connected via open loop between the intermediate terminal and the output terminal;

a second negative gain transconductance amplifier with characteristics that are essentially identical to those of the first amplifier, connected via closed loop; its input and output are connected to the intermediate terminal via a resistance.

According to one variation, the second amplifier is configured to impose a static polarisation voltage from the first amplifier on the intermediate terminal that is equal to half the power supply voltage of the first amplifier.

According to another variant, the amplifier circuit includes a capacitive load connected to the output terminal.

According to yet another variant, the first and second negative gain transconductance amplifiers include an NMos transistor and a PMos transistor where their grids are connected at the amplifier input and their drains are connected to the amplifier output; the PMos transistor source is connected to a power supply voltage and the NMos transistor source is connected to a ground voltage.

We can therefore expect that the NMos transistors of the first and second amplifiers have a channel length that is essentially identical, a channel width that is essentially identical, and a mobility that is essentially identical and that the PMos transistors of the first and second amplifiers have a channel length that is essentially identical, an identical channel width, and an identical mobility.

According to one variant, the PMos transistors and the NMos transistors are matched.

According to yet another variant, the resistance between the intermediate terminal and the input of the second amplifier includes a transistor that is kept on by a static polarisation voltage.

The invention also relates to an amplifier circuit that includes:

the amplifier circuit in which the first and second negative gain transconductance amplifiers include an NMos transistor and a PMos transistor;

a circuit that applies a test signal on the input terminal of the amplifier circuit;

a counter that increments when a blocking signal is absent;

a current source that applies a current to the PMos transistor source from the first amplifier; the current applied increases as the counter increases;

a comparator that has a first input connected to the output terminal of the amplifier circuit and a second input that receives a reference level; the comparator applies a blocking signal to the counter when the first input level is greater than the second input level.

The invention also relates to a radiofrequency reception circuit that has a homodyne reception chain equipped with a mixer, and an amplifier circuit such that the input terminal is connected to the output of the mixer.

Other features and advantages will become evident from the description that follows, provided by way of indication and in no way restrictive, with reference to the attached figures, in which.

Figure 1:
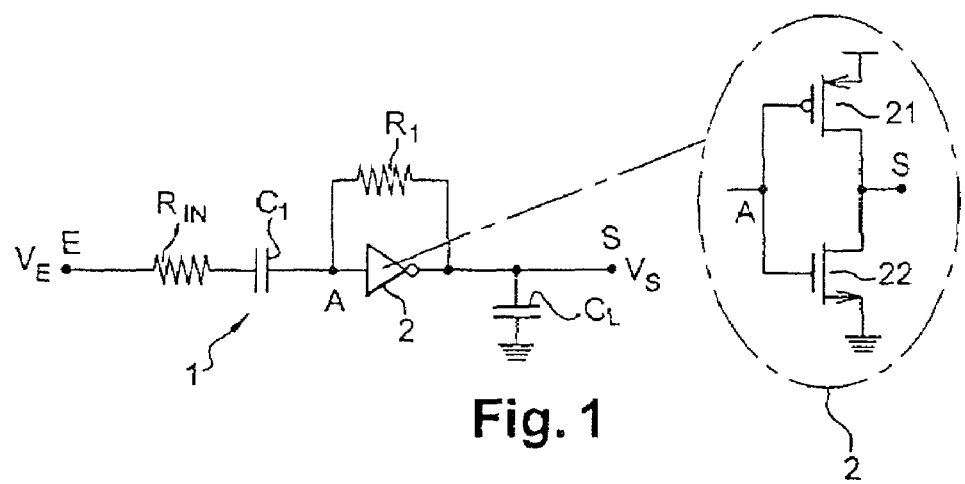
FIG. 1 illustrates an example of a negative gain transconductance amplifier circuit according to the prior art.
Figure 3:
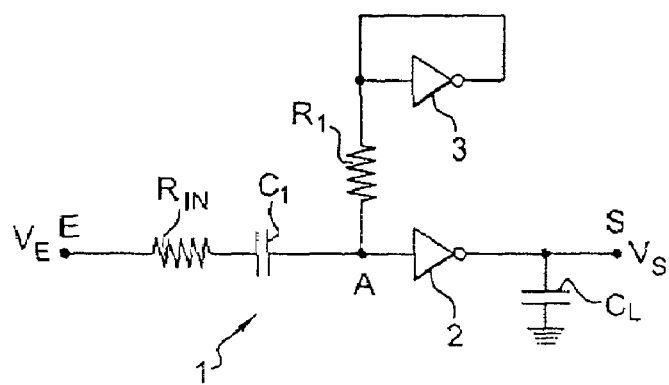
FIG. 3 illustrates a first variant of the amplifier circuit of FIG. 2.
Figure 5:
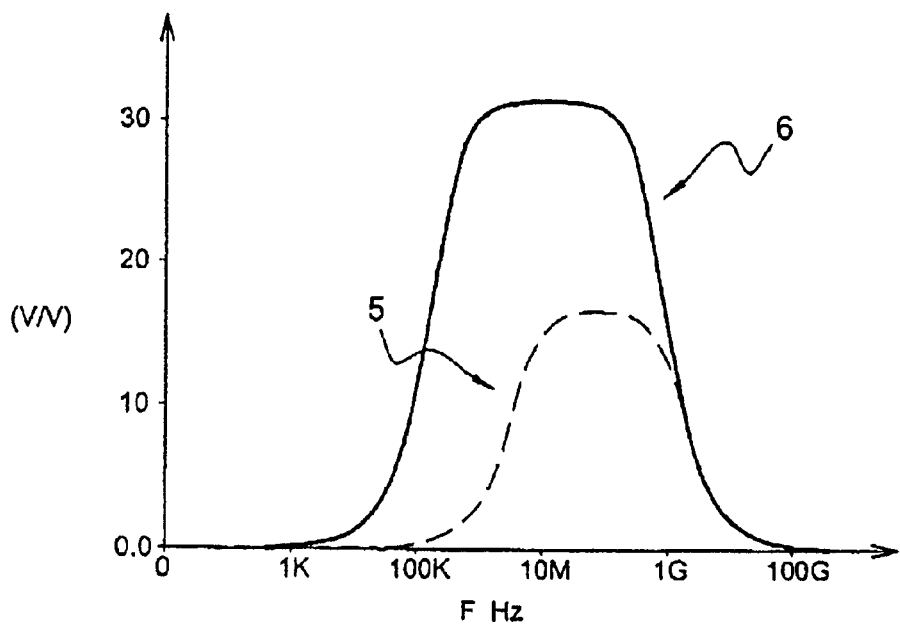
Figure 6:
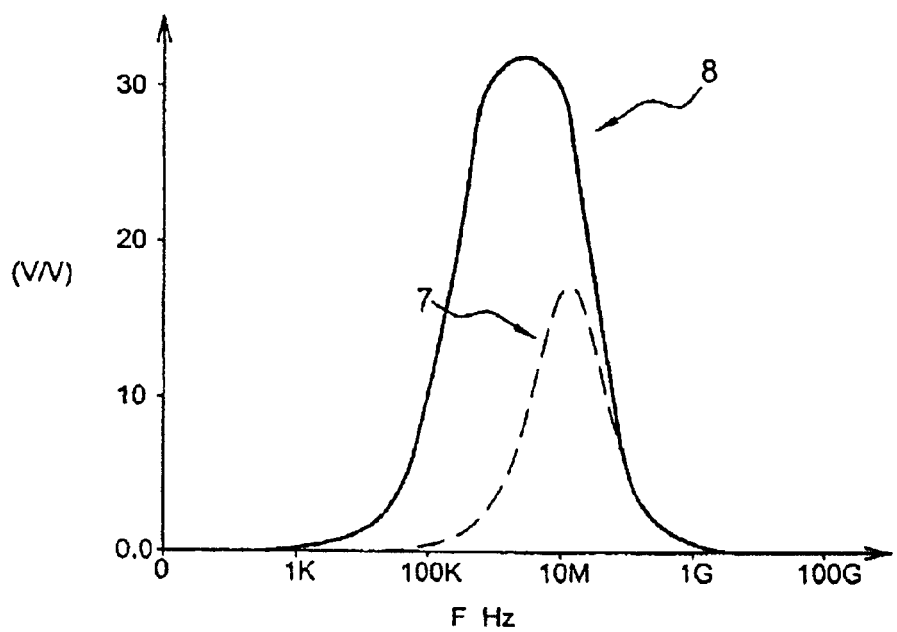
Figure 7:
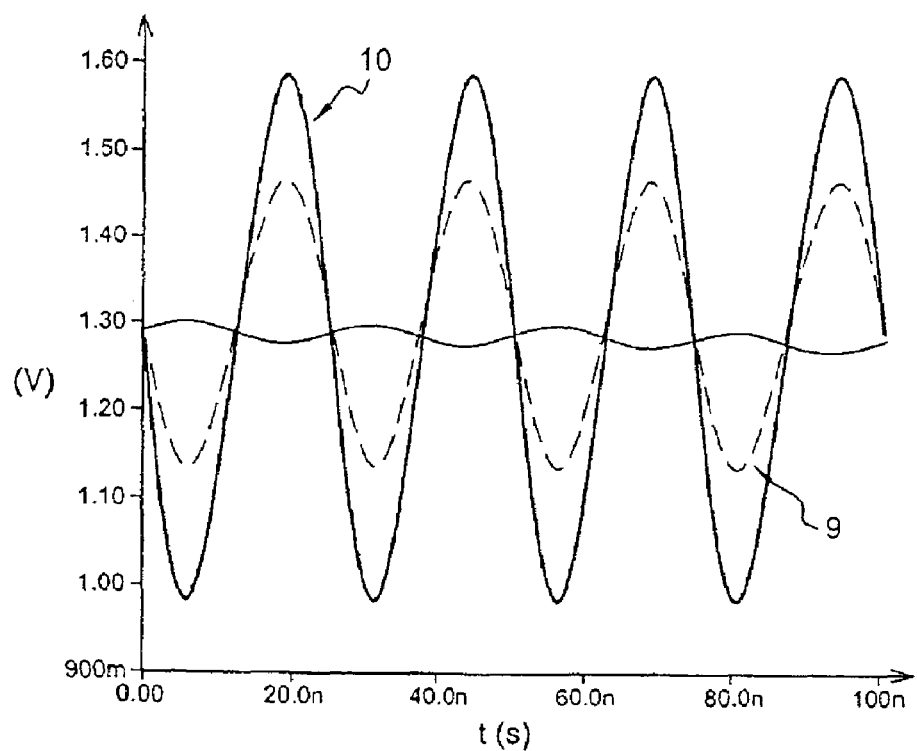
Figure 8:
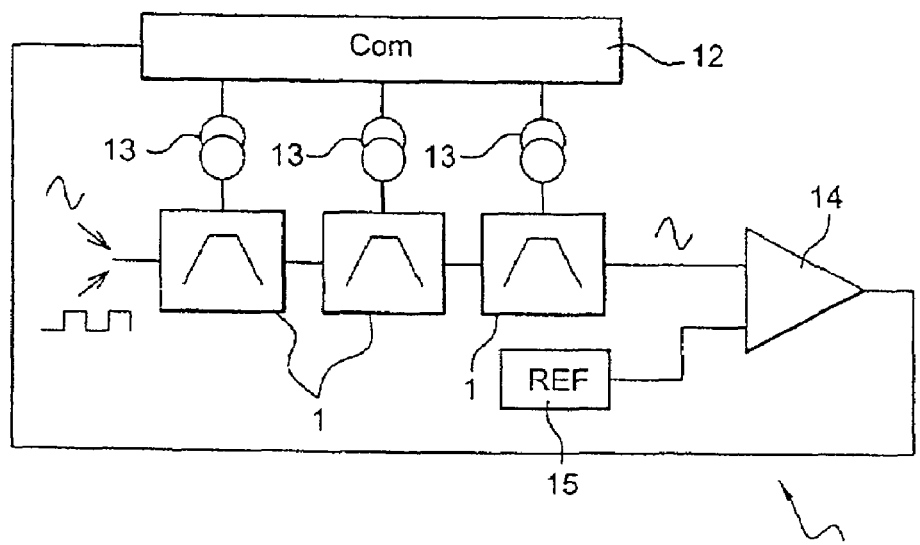
Figure 9:
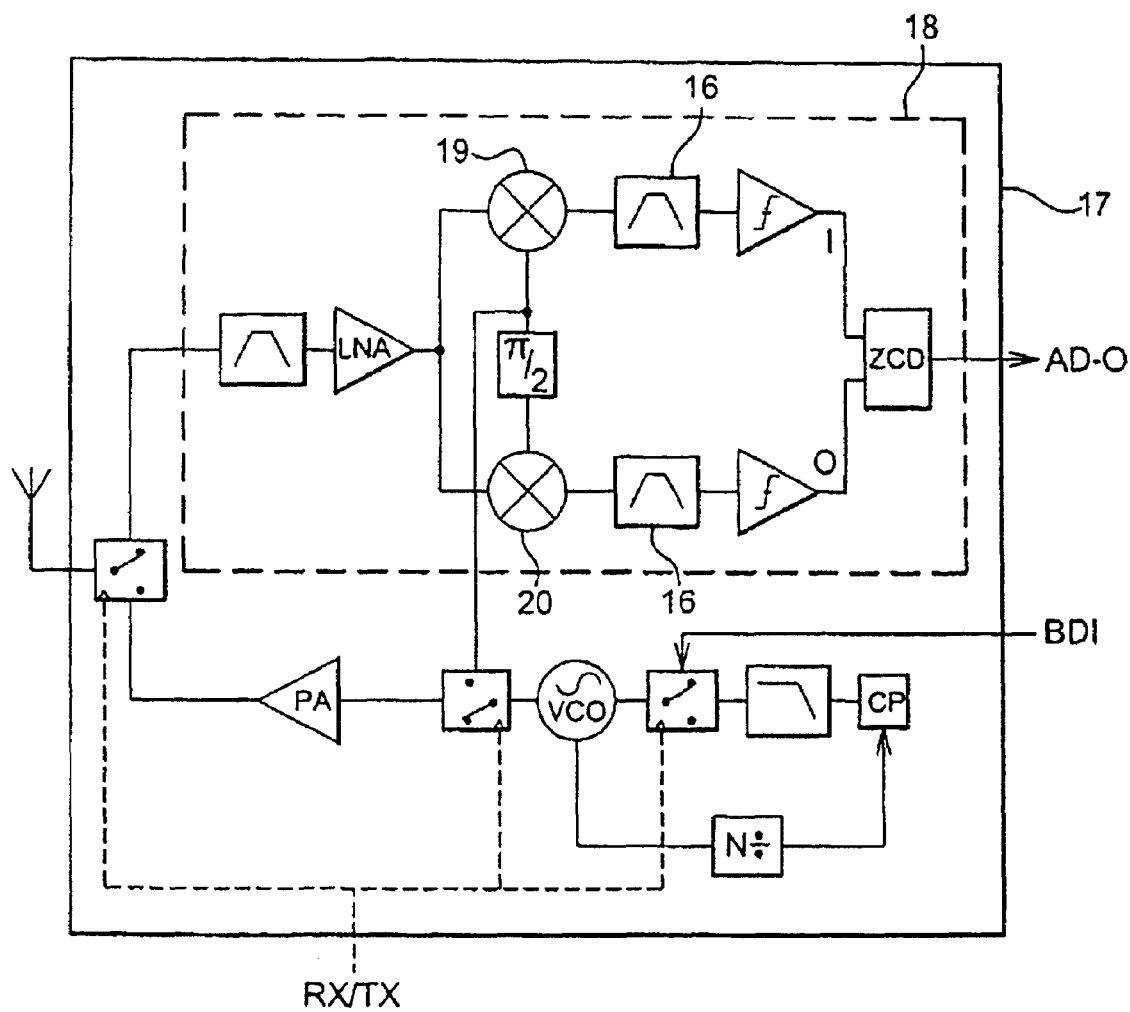

FIG. 5 compares the loadless voltage transfer amplitudes between the amplifier circuits of FIGS. 1 and 3;

FIG. 6 compares the voltage transfer amplitudes under capacitive load of the amplifier circuits of FIGS. 1 and 3;

FIG. 7 compares the loadless transient responses of the amplifier circuits of FIGS. 1 and 3 in their passband;

FIG. 8 illustrates an example of a circuit incorporating the amplifier circuits according to the invention;

FIG. 9 illustrates a transmission/reception chain incorporating the circuit of FIG. 8.

The invention proposes a negative gain transconductance amplifier circuit for capacitive load that presents a modified amplification stage. A first negative gain transconductance amplifier is intended to amplify the input signal and is connected in open circuit. A second amplifier has characteristics that are essentially identical to those of the first and is connected in closed circuit and its input and output are connected to the input of the first amplifier via a resistance.

The absolute value of the amplification gain is thus increased, the size of the capacitive load can be increased for a given gain, the low cut-off frequency of the amplifier is lowered as well as the distortion level and the gain passband product is maintained. The circuit according to the invention thus combines the advantages of an open-loop amplifier and the advantages of a closed-loop amplifier.

Figure 2:
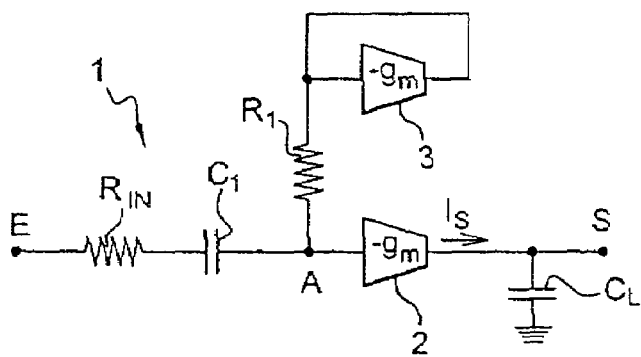
FIG. 2 illustrates an example of a negative gain transconductance amplifier circuit according to the invention.

FIG. 2 represents an example of an amplifier circuit according to the invention. A serial RC circuit is connected between an input terminal E and an intermediate terminal A. The capacitance $C_1$ allows filtering the continuous component of the signal applied to terminal E. The amplification stage, connected between the intermediate terminal A and an output terminal S includes a first negative gain transconductance amplifier 2 connected via open-loop between terminals A and S. The amplification stage also includes a second negative gain transconductance amplifier 3 connected via closed loop; its input and output are connected to terminal A via the resistance R1. Amplifier 3 has characteristics that are essentially identical to those of amplifier 2. The amplifiers therefore have the same common mode. A capacitive load $C_L$ is connected between the output terminal S and a ground.

Amplifier 3 is configured to impose a static polarisation voltage of amplifier 2 equal to half the power supply voltage of amplifier 2. Around this polarisation point, amplifier 2 behaves as a voltage controlled current source.

By essentially identical characteristics of amplifiers 2 and 3, is understood identical technology, essentially identical components, having the same structure and the same voltage levels. The illustrated amplifiers 2 and 3 only differ in the connections of their inputs and outputs.

The circuit in FIG. 3 uses amplifiers 2 and 3, each of which includes a CMOS inverter. As in the example in FIG. 1, each CMOS inverter includes an NMos transistor and a PMos transistor where their grids are connected to the amplifier input, and their drains are connected to the amplifier output; the PMos transistor source is connected to a $V_{DD}$ power supply voltage and the NMos transistor source is connected to ground.

The NMos transistors of amplifiers 2 and 3 have an identical channel length, an identical channel width, and identical mobility within the manufacturing deviations. Similarly, the PMos transistors of amplifiers 2 and 3 have an identical channel length, an identical channel width, and identical mobility within the manufacturing deviations. Preferably, the NMos transistors of amplifiers 2 and 3 are matched in order to improve the adaptation of their common modes and thus increase the amplification gain absolute value Similarly, the PMos transistors of these amplifiers are matched.

The amplifier circuit therefore presents the following characteristics for $|A_V|>>1$:

$$A_V \sim -g_m * R_0$$

With respect to the solution in FIG. 1, the gain is therefore theoretically increased by the order of $(R_0+R_1)/R_1$.

The input and output impedances in the passband are defined by the following formulas:

$$Z_E = R_1 + (R_M//C_G)$$

$$Z_S = R_0$$

Where $R_M$ is defined by $1/(g_mN+g_mP)$, $g_mN$ and $g_mP$ are the respective output transconductances of the NMos and PMos transistors in saturation regime, $C_G$ is the input parasite capacitance of amplifiers 2 and 3, $(R_M//C_G)$ is the impedance equivalent to placing $R_M$ and $C_G$ in parallel.

The low and high cut-off frequencies (for $R_0>>R_M$) are therefore defined by:

$$Fcb \sim 1/(2\pi * R_1 * C_1)$$

$$Fch \sim 1/(2\pi * R_0 * C_L)$$

The low cut-off frequency is therefore approximately reduced by a factor that is essentially equal to the $A_V$ voltage transfer amplitude.

Figure 4:
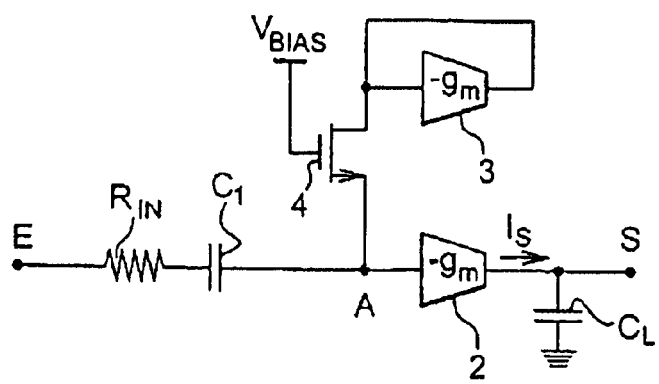
FIG. 4 illustrates a second variant of the amplifier circuit of FIG. 2.

Preferably, resistance R1 is comprised of a transistor 4 connected between terminal A and the amplifier 3 input. The transistor is kept on in linear regime by a static polarisation voltage. Transistor 4 is, for example, an NMos or PMos transistor. In the example in FIG. 4, the transistor 4 grid is supplied by a Vbias voltage; the NMos source is connected to terminal A and its drain is connected to the amplifier 3 input and output.

Performance comparisons between the amplifiers in FIGS. 1 and 3 have been simulated and are illustrated in FIGS. 5 to 7. The parameters used for the simulation are the following:

R1=30Ω, Rin=200Ω, and C1=20pF;

$W_N/L_N=3$, $\mu_N=0.35$; $W_P/L_P=9$, $\mu_P=0.35$;

FIG. 1

| Parameters | Proposed Topology | Topology Ref [1] | Unit |
|---|---|---|---|
| $V_{DD}$ power supply voltage | 2.5 | | V |
| $V_{SS}$ = gnd power supply voltage | 0 | | V |
| Polarisation voltage at output | 1.285 | | V |
| NMOS transconductance ($g_mN$) | 814.4μ | | $\Omega^{-1}$ |
| NMOS conductance ($g_{DSN}$) | 25μ | | $\Omega^{-1}$ |
| PMOS transconductance ($g_mP$) | 950μ | | $\Omega^{-1}$ |
| PMOS conductance ($g_{DSP}$) | 30μ | | $\Omega^{-1}$ |
| Input impedance in band (module) | 30 k | 1.7 k | $\Omega$ |
| Output resistance | 19.48 k | 10.4 k | $\Omega$ |
| Total harmonic distortion rate (1 $V_{CC}$ at loadless output) | 5.5 | 3.94 | % |
| Total consumption | 1927 | 964 | μW |
| $C_L$~16 fF loadless simulation | | | |
| $V_S/V_E$ voltage gain in band | −31.5 | −16.7 | V/V |
| Product (passband * gain) (−3 dB) | 17.2 | 16 | GHz |
| Low cut-off frequency (−3 dB) | 0.251 | 4.62 | MHz |
| High cut-off frequency (−3 dB) | 549 | 965 | MHz |
| Simulation for CL = 0.5 pF | | | |
| VS/VE voltage gain in band | −31 | −16.6 | V/V |
| Passband * gain product) (−3 dB) | 504 | 495 | MHz |

FIG. 5 compares the loadless voltage transfer amplitudes. Curves 5 and 6 correspond, respectively, to the amplifiers in FIGS. 1 and 3. It can be observed that the low cut-off frequency of the amplifier according to the invention is notably lower than that of the amplifier according to the prior art. The maximum voltage transfer amplitude of the amplifier according to the invention is much greater than that of the amplifier of the prior art. Furthermore, the product of the gain by the passband is essentially maintained.

FIG. 6 compares the voltage transfer amplitudes with a capacitive load. Curves 7 and 8 correspond, respectively, to the amplifiers in FIGS. 1 and 3. Again, it can be observed that the amplifier low cut-off frequency according to the invention is markedly lower than that of the amplifier according to the prior art. The maximum voltage transfer amplitude of the amplifier according to the invention is again much higher than that of the amplifier according to the prior art. The product of the gain by the passband is also essentially maintained.

FIG. 7 compares the loadless transient responses of the amplifiers in FIG. 1 and 3. Curves 9 and 10 correspond, respectively, to the amplifiers in FIG. 1 and 3. It can be observed that the amplifier circuit according to invention does not create any significant distortions of the amplified signal with respect to the amplifier circuit of the state of the art.

Although we have mainly described an example of a circuit equipped with CMOS type amplifiers, the invention is also applicable to other types of negative gain transconductance amplifiers.

Because of its amplification and passband filtering properties, an amplifier circuit like the one described above is advantageously incorporated into an amplifier circuit that calibrates its passband. FIG. 8 illustrates an amplifier circuit 16 with a calibrated passband incorporating amplifier circuits 1 according to the invention.

Circuit 16 includes a counter 12 that controls the current sources 13. Each time the counter 16 increments, the current set point applied to the current sources 13 increases. Each current source 13 is connected to a respective amplifier circuit 1. The amplifier circuit 1 outputs are connected to an input of the comparator 14. The other input of the comparator 14 receives a passband set point provided by the reference circuit 15.

By using an amplifier circuit 1 according to FIG. 3, the current of a source 13 is injected onto the PMos transistor sources of amplifiers 2 and 3. The passband of amplifier circuit 1 is therefore essentially proportional to the current level applied by the current source.

The calibration phase is performed as follows: the counter is initially set at a low level. The current applied to each source 13 on its amplifier circuit 1 is therefore low. The passband of each amplifier circuit 1 is thus initially reduced. A test signal is applied to the input terminal of each amplifier circuit 1. The signal level on the output terminal of each amplifier circuit 1 is representative of its passband. As long as the signal level on the output terminal is less than the passband set point provided by circuit 15, the output signal of the comparator controls the increase of counter 12. Counter 12 increases and the source 13 current thus increases, until the signal level over the output terminal of an amplifier circuit 1 exceeds the passband set point. The output signal of the comparator thus controls the blocking of counter 12. The passband of the amplifier circuits 1 is thus calibrated.

The test signal applied on the input terminal of the amplifier circuit is, for example, a square wave clock signal. A sinusoidal test signal may also be applied where its frequency is the desired high cut-off frequency. Calibration may be performed at regular intervals in order to compensate for the drift of the amplifier circuit 1 components.

For an amplifier circuit 1 that has CMOS transistor amplifiers, the consumption and size of the transistors can be reduced by calibration: the amplifier only consumes the current that corresponds to the necessary calibrated passband.

Amplifier circuits 1 are particularly adapted for each reception chain since they have a lowered cut-off frequency; their passband can therefore include signals coming from mixers.

Amplifier circuits 16 are therefore advantageously incorporated into the homodyne reception chain. FIG. 9 illustrates a radiofrequency communication circuit 17 with a homodyne reception chain 18 equipped with mixers 19 and 20. The output of each mixer is connected to the input terminal of amplifier circuit 1 of an amplifier circuit 16.

The calibration of an amplifier circuit passband can be performed at regular intervals, for example, every second.

The invention claimed is:
1. A negative gain transconductance amplifier circuit for capacitive load, the circuit comprising:
   an RC serial circuit connected between an input terminal of the amplifier circuit and an intermediate terminal; and
   an amplification stage connected between the intermediate terminal and an output terminal intended to be connected to a capacitive load, wherein the amplification stage comprises:
      a first negative gain transconductance amplifier connected via open loop between the intermediate terminal and the output terminal; and
      a second negative gain transconductance amplifier with characteristics that are essentially identical to those of the first amplifier, connected via closed loop; its input and output are connected to the intermediate terminal via a resistance.

2. The circuit according to claim 1, wherein the second amplifier is configured to impose a static polarization voltage from the first amplifier on the intermediate terminal that is equal to half the power supply voltage of the first amplifier.

3. The circuit according to claim 1, further comprising a capacitive load connected to the output terminal.

4. The circuit according to claim 1, wherein the first and second negative gain transconductance amplifiers include an NMOS transistor and a PMOS transistor where its grids are connected to the amplifier input and where its drains are connected to the amplifier output; the PMOS transistor source is connected to a power supply voltage and the NMOS transistor source is connected to a ground voltage.

5. The circuit according to claim 4, wherein:
the NMOS transistors of the first and second amplifiers have essentially identical channel lengths, channel widths, and mobility;
the PMOS transistors of the first and second amplifiers have essentially identical channel lengths, channel widths, and mobility.

6. The circuit according to claim 4, wherein the PMOS transistors and the NMOS transistors are matched.

7. The circuit according to claim 1, wherein the resistance between the intermediate terminal and the input of the second amplifier comprises a transistor that is kept on by a static polarization voltage.

8. The circuit according to claim 1 further comprising:
a circuit that applies a test signal on the input terminal of the amplifier circuit;
a counter that increments when a block signal is absent;
a current source that applies a current to the PMOS transistor source of the first amplifier, wherein the applied current crosses as the counter increases; and
a comparator having a first input connected to the output terminal of the amplifier circuit and a second input that receives a reference level; the comparator applies a blocking signal to the counter when the level of the first input is greater than the level of the second input.

9. A radiofrequency reception circuit comprising the amplifier circuit according to claim 8, wherein the reception circuit comprises a homodyne reception chain equipped with a mixer and, the input terminal is connected to the output of the mixer.

10. A negative gain transconductance amplifier circuit, comprising:
a first resistance element;
a first capacitor element connected in series with the first resistance element; and
an amplification stage connected in series with the first capacitor element at an intermediate terminal, the amplification stage having first and second negative gain transconductance amplifiers, the first and second negative gain transconductance amplifiers having similar operating characteristics and a similar common mode, the first negative gain transconductance amplifier providing an amplification stage output,
wherein the first negative gain transconductance amplifier is an open-loop amplifier, and the second negative gain transconductance amplifier is a closed-loop amplifier having an input and output connected to the intermediate terminal via a resistance.

11. The negative gain transconductance amplifier circuit of claim 10, wherein the second negative gain transconductance amplifier is configured as a voltage-controlled current source providing a static polarization voltage approximately equal to half of a power supply voltage of the first negative gain transconductance amplifier.

12. The negative gain transconductance amplifier circuit of claim 10, further comprising a capacitive load connected to the amplification stage output.

13. The negative gain transconductance amplifier circuit of claim 10, wherein the first negative gain transconductance amplifier comprises an NMOS transistor and a PMOS transistor connected in series between a first voltage and a second voltage, an amplifier input connected to the gates of the NMOS and PMOS transistors, and an amplifier output connected to the drains of the NMOS and PMOS transistors.

14. The negative gain transconductance amplifier circuit of claim 13, wherein the second negative gain transconductance amplifier comprises an NMOS transistor and a PMOS transistor connected in series between a first voltage and a second voltage, an amplifier input connected to the gates of the NMOS and PMOS transistors, and an amplifier output connected to the drains of the NMOS and PMOS transistors.

15. The negative gain transconductance amplifier circuit of claim 14, wherein the NMOS transistors of the first and second negative gain transconductance amplifiers have a channel length that is essentially identical, a channel width that is essentially identical, and mobility that is essentially identical, and the PMOS transistors of the first and second negative gain transconductance amplifiers have a channel length that is essentially identical, an identical channel width, and an identical mobility.

16. The negative gain transconductance amplifier circuit of claim 14, wherein the PMOS transistors and the NMOS transistors are matched.

17. The negative gain transconductance amplifier circuit of claim 14, wherein the first voltage is a power supply voltage and second voltage is ground.

18. The negative gain transconductance amplifier circuit of claim 10, wherein the resistance comprises a transistor that is kept on by the second negative gain transconductance amplifier.

19. A method for amplifier calibration, comprising
setting a counter;
applying a current to a negative gain transconductance amplifier circuit according to an output of the counter;
applying a test signal to the negative gain transconductance amplifier circuit;
comparing a signal level at an output of the negative gain transconductance amplifier circuit to a reference value; and
incrementing the counter while the signal level is less than the reference value.

20. The method of claim 19, wherein the negative gain transconductance amplifier circuit comprises
a first resistance element;
a first capacitor element connected in series with the first resistance element; and
an amplification stage connected in series with the first capacitor element at an intermediate terminal, the amplification stage having first and second negative gain transconductance amplifiers, the first and second negative gain transconductance amplifiers having similar operating characteristics and a similar common mode, the first negative gain transconductance amplifier providing an amplification stage output,
wherein the first negative gain transconductance amplifier is an open-loop amplifier, and the second negative gain transconductance amplifier is a closed-loop amplifier having an input and output connected to the intermediate terminal via a resistance.

* * * * *